United States Patent
Fujiyama

(10) Patent No.: US 8,093,881 B2
(45) Date of Patent: Jan. 10, 2012

(54) REFERENCE VOLTAGE GENERATION CIRCUIT WITH START-UP CIRCUIT

(75) Inventor: Hirokuni Fujiyama, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/040,918

(22) Filed: Mar. 4, 2011

(65) Prior Publication Data

US 2011/0156690 A1 Jun. 30, 2011

Related U.S. Application Data

(63) Continuation of application No. PCT/JP2009/000804, filed on Feb. 24, 2009.

(30) Foreign Application Priority Data

Sep. 5, 2008 (JP) .................................. 2008-228466

(51) Int. Cl.
*G05F 3/16* (2006.01)
(52) U.S. Cl. ........................ 323/313; 323/316; 323/901
(58) Field of Classification Search .................. 323/313, 323/314, 315, 316, 901
See application file for complete search history.

(56) References Cited

U.S. PATENT DOCUMENTS

| | | | |
|---|---|---|---|
| 5,686,823 A | 11/1997 | Rapp | |
| 5,751,142 A * | 5/1998 | Dosho et al. | 323/316 |
| 5,867,013 A * | 2/1999 | Yu | 323/314 |
| 6,018,235 A | 1/2000 | Mikuni | |
| 6,091,285 A | 7/2000 | Fujiwara | |
| 6,507,180 B2 * | 1/2003 | Eguchi | 323/314 |
| 7,659,705 B2 * | 2/2010 | Hung | 323/313 |
| 2006/0006927 A1 | 1/2006 | Nakada | |

FOREIGN PATENT DOCUMENTS

| | | |
|---|---|---|
| JP | 11-338567 | 12/1999 |
| JP | 2006-23920 | 1/2006 |

OTHER PUBLICATIONS

V. V. Ivanov et al., "Operational Amplifier Speed and Accuracy Improvement," pp. 38-42, 2004.

* cited by examiner

*Primary Examiner* — Jeffrey Sterrett
(74) *Attorney, Agent, or Firm* — McDermott Will & Emery LLP

(57) ABSTRACT

A first resistance element is coupled between a first rectifying element and an output node at which a reference voltage is generated. Second and third resistance elements are coupled in series between a second rectifying element and the output node. A differential amplifier outputs a control voltage corresponding to a difference between a first voltage generated at a connection point of the first rectifying element and the first resistance element and a second voltage generated at a connection point of the second resistance element and the third resistance element. A control circuit supplies a control current corresponding to the control voltage from the differential amplifier. A start-up circuit causes, by supplying a start-up current to the output node in response to supply of a power supply voltage, transition from a first stable state to a second stable state.

11 Claims, 12 Drawing Sheets

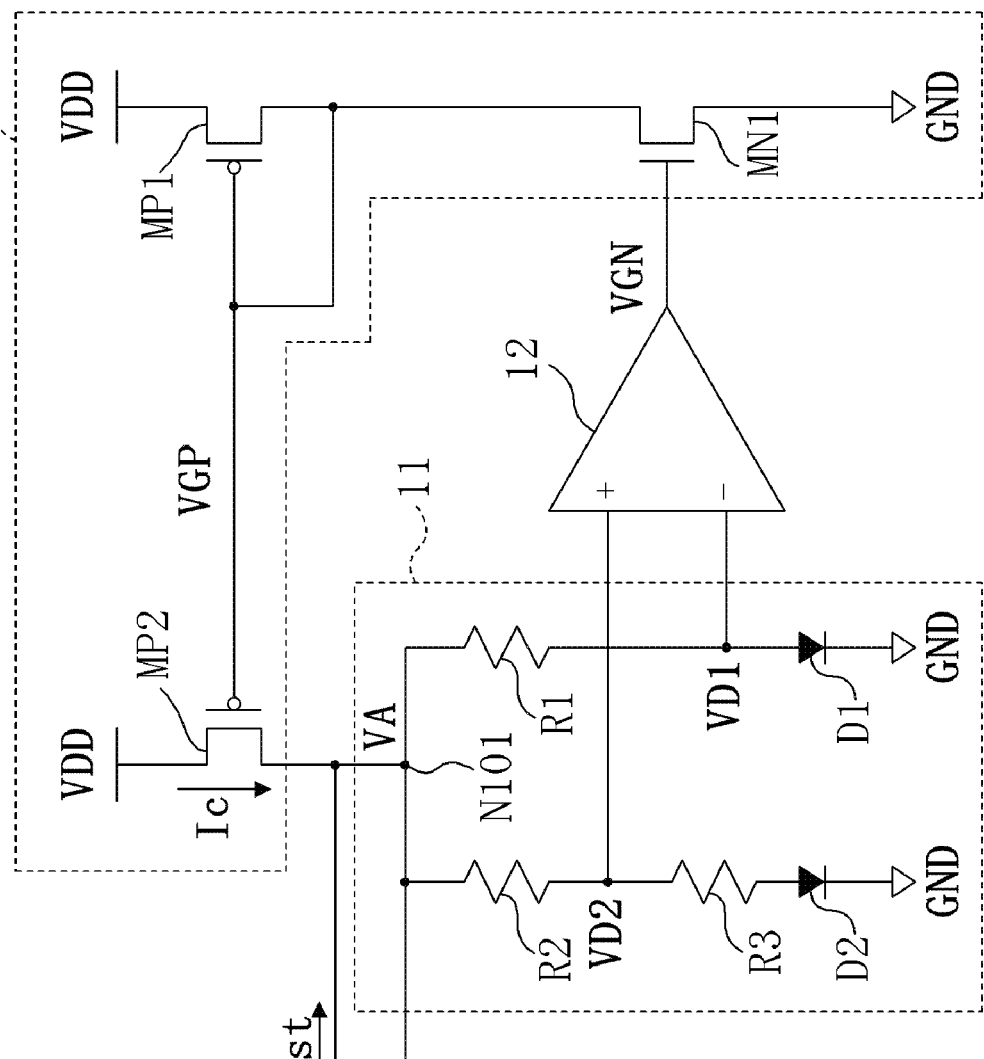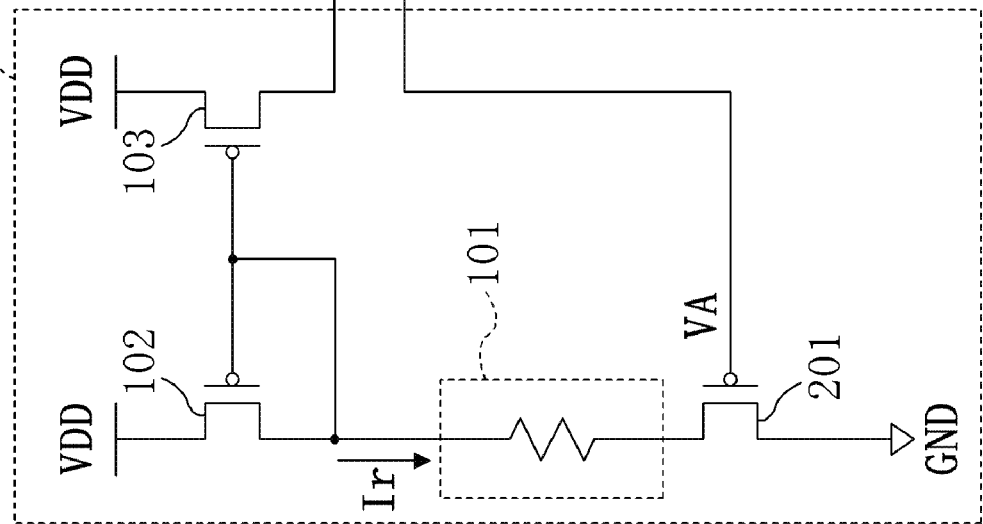
FIG.2

FIG.8
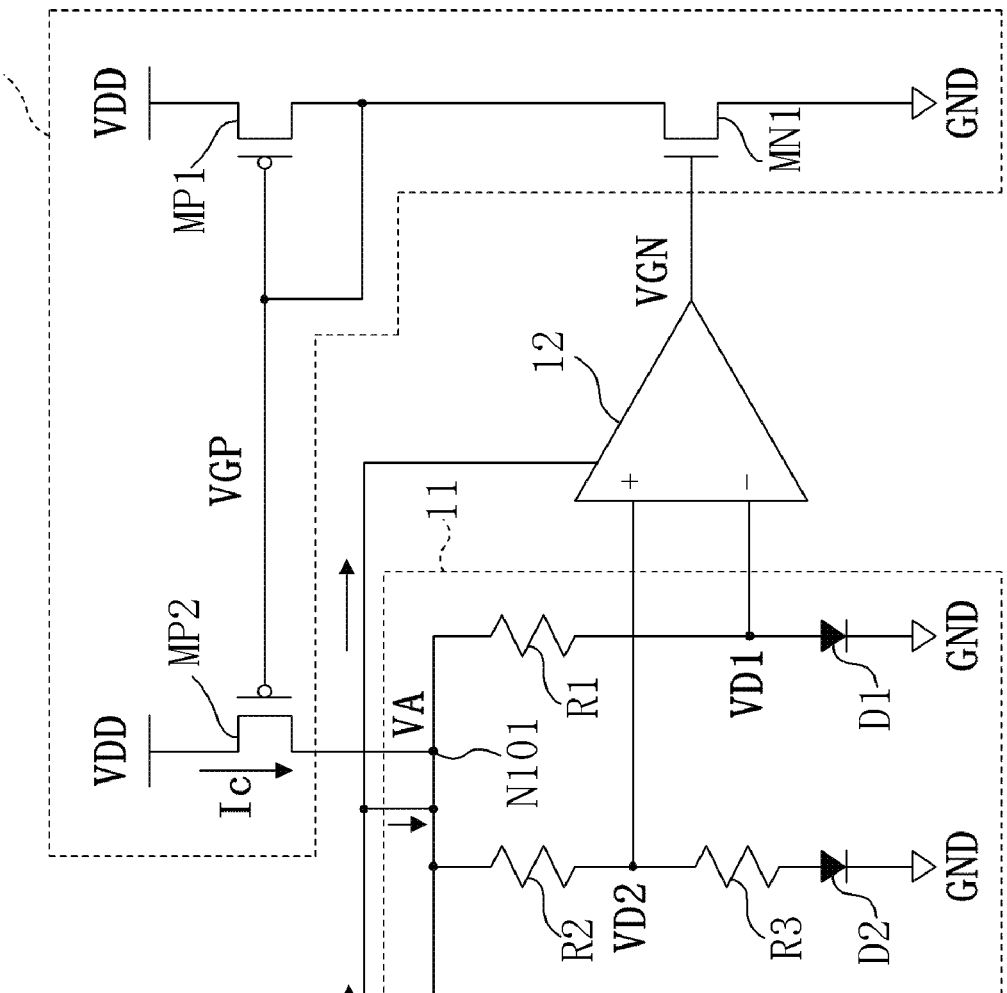
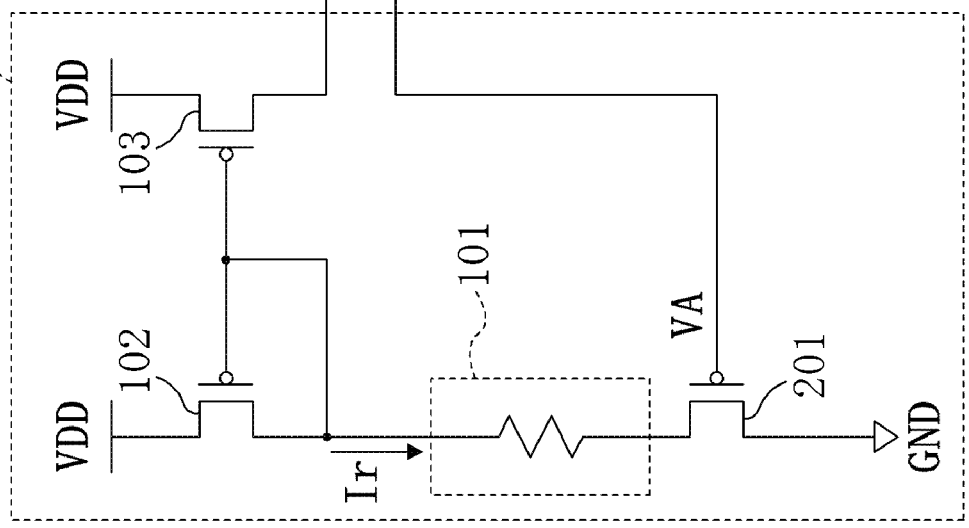

REFERENCE VOLTAGE GENERATION CIRCUIT WITH START-UP CIRCUIT

CROSS-REFERENCE TO RELATED APPLICATION

This is a continuation of PCT International Application PCT/JP2009/000804 filed on Feb. 24, 2009, which claims priority to Japanese Patent Application No. 2008-228466 filed on Sep. 5, 2008. The disclosures of these applications including the specifications, the drawings, and the claims are hereby incorporated by reference in their entirety.

BACKGROUND

The present disclosure relates to a reference voltage generation circuit, and more particularly to a start-up technique for a reference voltage generation circuit.

Conventionally, bandgap reference circuits are used to reduce variations in circuit characteristics due to changes in power supply voltage and temperature. Such a bandgap reference circuit generates a reference voltage with low dependence on the power supply voltage and temperature.

FIG. 10 illustrates a configuration of a reference voltage generation circuit including a typical bandgap reference circuit 90. In the bandgap reference circuit 90, a control current Ic is controlled so that a voltage (a connection point voltage VD1) at a connection point of a resistance element R1 and a diode element D1 and a voltage (a connection point voltage VD2) at a connection point of resistance elements R2 and R3 are equal to each other. When the connection point voltages VD1 and VD2 are equal to each other, a reference voltage VA is stabilized. The reference voltage VA can be expressed by Equation 1 or Equation 2.

$$VA = VD1 + \frac{\Delta VD}{R3} \cdot \frac{R2}{R1} \cdot R1 \qquad \text{[Equation 1]}$$

$$VA = VD1 + \frac{R2}{R3} \cdot \frac{kT}{q} \cdot \ln\left(\frac{R2}{R1} \cdot \frac{Is2}{Is1}\right) \qquad \text{[Equation 2]}$$

In Equations 1 and 2, "$\Delta VD$" is a difference between a threshold voltage of a diode D1 (i.e., the connection point voltage VD1) and a threshold voltage of a diode D2, "k" is Boltzmann constant, "T" is the absolute temperature, "q" is the amount of electron charge, "Is1" is the saturation current of the diode D1, and "Is2" is the saturation current of the diode D2. In this case, the threshold voltage (VD1) of the diode D1 has a negative temperature characteristic, and the difference voltage $\Delta VD$ has a positive temperature characteristic. Because of a virtual short-circuit of a differential amplifier, a potential difference across the resistance element R3 is equal to the difference voltage $\Delta VD$, and a current flowing in the resistance element R1 is "$(\Delta VD/R3) \times (R2/R1)$." That is, a voltage having a positive voltage characteristic is generated at the resistance element R1. Since the temperature characteristic of the threshold voltage (VD1) of the diode D1 is canceled out by the voltage generated at the resistance element R1, the reference voltage VA is not dependent on temperature. In Equations 1 and 2, there is no term dependent on the power supply voltage VDD. Thus, it is understood from the equations that the reference voltage VA is also not dependent on the power supply voltage VDD.

Next, the relationship between the reference voltage VA and the connection point voltages VD1 and VD2 will be described with reference to FIG. 11. The connection point voltage VD2 increases with an increase of the reference voltage VA. However, the connection point voltage VD1 becomes constant, after the reference voltage VA exceeds a predetermined voltage level. Thus, there are two points where the connection point voltages VD1 and VD2 are equal to each other. That is, the bandgap reference circuit 90 has an operating stable state where the reference voltage VA is stabilized at a desired voltage level Vx, and a non-operating stable state where the reference voltage VA is stabilized at a voltage level (e.g., a voltage level Vy) lower than the desired voltage level. When the bandgap reference circuit 90 is in the operating stable state, Equations 1 and 2 hold, and therefore, a reference voltage with low dependence on the power supply voltage and temperature can be generated. On the other hand, when the bandgap reference circuit 90 is in the non-operating stable state, the reference voltage VA, the connection point voltages VD1 and VD2, and a control voltage VGN are stabilized at a voltage level close to the ground voltage GND, and a control voltage VGP is stabilized at a voltage level close to the power supply voltage VDD. Thus, the reference voltage VA cannot be maintained at the desired voltage level Vx. Also, the bandgap reference circuit 90 easily becomes in the non-operating stable state at a start of operation (at the time when the power supply voltage VDD is supplied).

Thus, to solve the above-described problems, the reference voltage generation circuit of FIG. 10 includes, in addition to the bandgap reference circuit 90, a current source CS for drawing a current from a connection point of an NMOS transistor and a PMOS transistor to a ground node (see, e.g., page 5 of the specification and FIG. 3 of U.S. Pat. No. 5,686,823). Since a current I91 is drawn by the current source CS, the control voltage VGP reduces, and the control current Ic increases. As a result, the reference voltage VA is forced to increase. Thus, the bandgap reference circuit 90 can be caused to transition from the non-operating stable state to the operating stable state. The reference voltage generation circuit of FIG. 12 includes, in addition to the bandgap reference circuit, a resistance element R for supplying a current from a power supply node to a differential amplifier 900 (see, e.g., "OPERATIONAL AMPLIFIER SPEED AND ACCURACY IMPROVEMENT," pp. 38-42, 2004, etc.). Since the current I92 is supplied by the resistance element R, the control voltage VGN increases, and the control voltage VGP reduces. As a result, the reference voltage VA can be forced to increase.

SUMMARY

However, in conventional reference voltage generation circuits, the reference voltage VA is increased by forcing a voltage (e.g., the control voltage VGP, etc.) which is not the reference voltage VA to change. Thus, a long time is required for the reference voltage generation circuit to transition from the non-operating stable state to the operating stable state.

Therefore, the present disclosure may allow a reference voltage generation circuit to transition from the non-operating stable state to the operating stable state in less time, as compared to conventional reference voltage generation circuits.

According to one aspect of the present disclosure, a reference voltage generation circuit which generates a reference voltage includes: a voltage generation circuit including a first rectifying element, a first resistance element coupled between the first rectifying element and an output node at which the reference voltage is generated, a second rectifying element, and second and third resistance elements coupled in series between the second rectifying element and the output node; a differential amplifier configured to output a control voltage corresponding to a difference between a first voltage generated at a connection point of the first rectifying element and the first resistance element and a second voltage generated at a connection point of the second resistance element and the third resistance element; a control circuit configured to supply a control current corresponding to the control voltage from the differential amplifier to the output node; and a start-up circuit configured to cause, by supplying a start-up current to the output node in response to supply of a power supply voltage, a transition from a first stable state where the reference voltage is stabilized at a voltage level lower than a desired voltage level to a second stable state where the reference voltage is stabilized at the desired voltage level. In the reference voltage generation circuit, the reference voltage is directly increased by the start-up current. Thus, as compared to the case where a voltage other than the reference voltage is directly increased in the reference voltage generation circuit, a transition time from the non-operating stable state to the operating stable state can be reduced. Therefore, the response characteristics of the reference voltage generation circuit to power supply can be improved.

Preferably, the start-up circuit reduces the start-up current in accordance with increase of the reference voltage generated at the output node. With this configuration, the power consumption of the start-up circuit can be reduced. Also, influences of the start-up current on the basic configuration (including the voltage generation circuit, the differential amplifier, and the control circuit) of the reference voltage generation circuit can be reduced, so that the reference voltage can be accurately generated.

Preferably, the start-up circuit also supplies the start-up current to the differential amplifier. With this configuration, the start-up current is supplied not only to the output node but also to the differential amplifier. Thus, the differential amplifier can be reliably driven. Also, the rate of increase of the control current can be increased, so that a transition time from the non-operating stable state to the operating stable state can be further reduced.

According to another aspect of the present disclosure, a reference voltage generation circuit which generates a reference voltage includes: a voltage generation circuit including a first rectifying element, a first resistance element coupled between the first rectifying element and an output node at which the reference voltage is generated, a second rectifying element, and second and third resistance elements coupled in series between the second rectifying element and the output node; a differential amplifier configured to output a control voltage corresponding to a difference between a first voltage generated at a connection point of the first rectifying element and the first resistance element and a second voltage generated at a connection point of the second resistance element and the third resistance element; a control circuit configured to supply a control current corresponding to the control voltage from the differential amplifier to the output node; and a start-up circuit configured to cause, by supplying a start-up current to the differential amplifier in response to supply of a power supply voltage, a transition from a first stable state where the reference voltage is stabilized at a voltage level lower than a desired voltage level to a second stable state where the reference voltage is stabilized at the desired voltage level, and reduce the start-up current in accordance with increase of the reference voltage generated at the output node. Thus, in the reference voltage generation circuit, the power consumption of the start-up circuit can be reduced, and the reference voltage can be accurately generated.

According to still another aspect of the present disclosure, a reference voltage generation circuit which generates a reference voltage includes: a voltage generation circuit including a first rectifying element, a first resistance element coupled between the first rectifying element and an output node at which the reference voltage is generated, a second rectifying element, and second and third resistance elements coupled in series between the second rectifying element and the output node; a differential amplifier configured to output a control voltage corresponding to a difference between a first voltage generated at a connection point of the first rectifying element and the first resistance element and a second voltage generated at a connection point of the second resistance element and the third resistance element; a control circuit configured to supply a control current corresponding to the control voltage from the differential amplifier to the output node; and a start-up circuit configured to cause, by supplying a start-up current to the differential amplifier in response to supply of a power supply voltage, a transition from a first stable state where the reference voltage is stabilized at a voltage level lower than a desired voltage level to a second stable state where the reference voltage is stabilized at the desired voltage level, and the start-up circuit includes a current source provided on a reference current path from a power supply node to which the power supply voltage is supplied to a ground node, and a current mirror circuit configured to generate a current corresponding to a reference current generated on the reference current path on an output current path through which the start-up current is supplied to the output node and the differential amplifier. In the reference voltage generation circuit, the amount of the start-up current can be arbitrarily changed by changing the mirror ratio of the current mirror circuit. Thus, as compared to conventional reference voltage generation circuits, increase in circuit area can be reduced, and the amount of the start-up current can be easily set.

BRIEF DESCRIPTION OF THE DRAWINGS

FIG. 2 is a diagram illustrating an example configuration of a reference voltage generation circuit of a second embodiment.

FIG. 8 is a diagram illustrating an example configuration of a reference voltage generation circuit according to a fourth embodiment.

DETAILED DESCRIPTION

Figure 1:
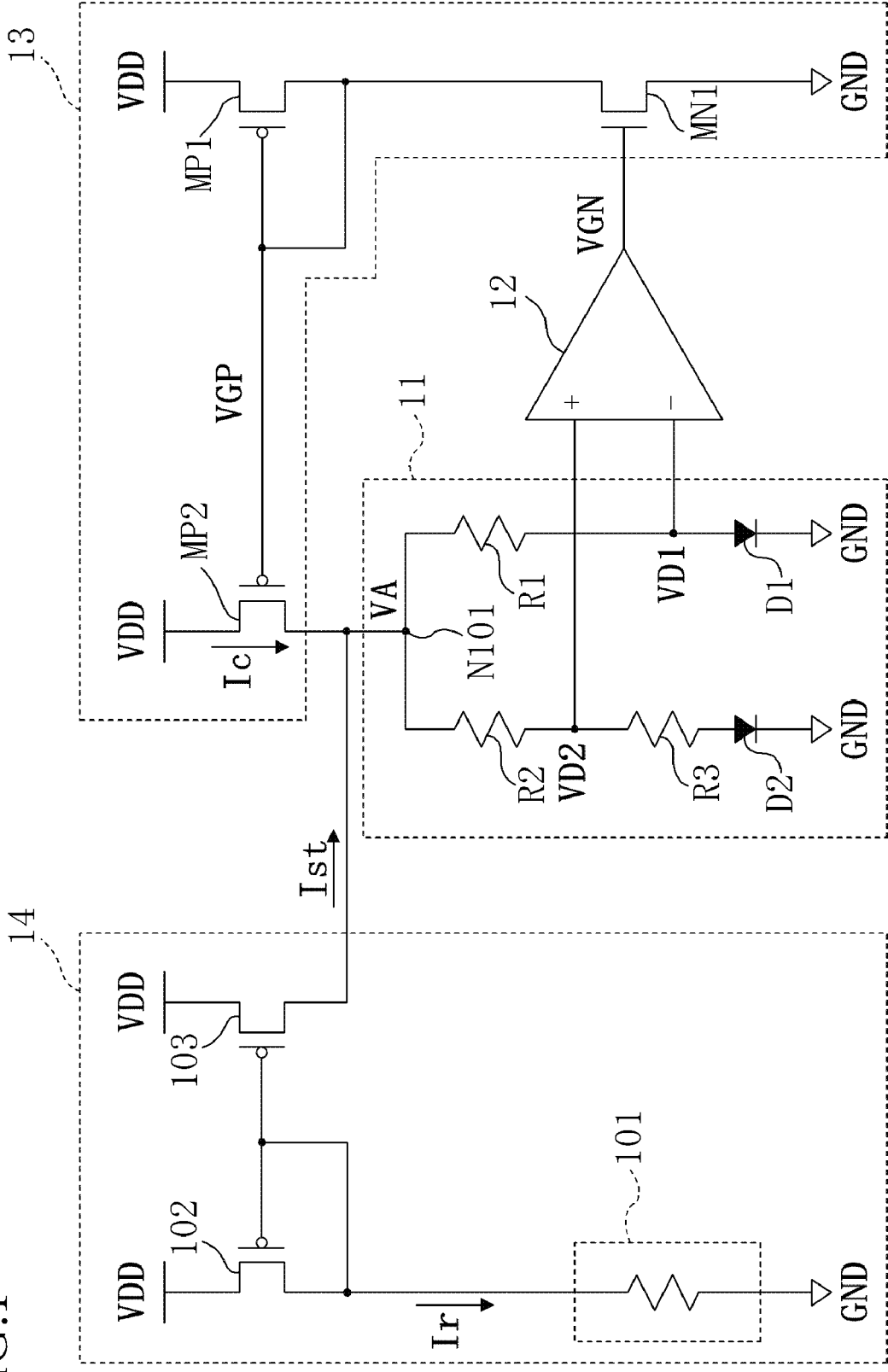
FIG. 1 is a diagram illustrating an example configuration of a reference voltage generation circuit according to a first embodiment.

Embodiments of the present disclosure will be described below in detail with reference to the accompanying drawings. Note that similar reference characters designate the same or similar elements in the drawings, and the explanation thereof is not repeated.

First Embodiment

FIG. 1 illustrates an example configuration of a reference voltage generation circuit according to a first embodiment. The reference voltage generation circuit generates a reference voltage VA with low dependence on a power supply voltage VDD and temperature by controlling a control current Ic so that connection point voltages VD1 and VD2 are equal to each other. The reference voltage generation circuit includes a voltage generation circuit 11, a differential amplifier 12, a control circuit 13, and a start-up circuit 14.

The voltage generation circuit 11 includes a rectifying element D1 (a diode in this case), a resistance element R1 coupled between an output node N101 and the rectifying element D1, a rectifying element D2, and resistance elements R2 and R3 coupled in series between the output node N101 and the rectifying element D2. The differential amplifier 12 outputs a control voltage VGN corresponding to a difference between a voltage (a connection point voltage VD1) generated at a connection point of the resistance element R1 and the rectifying element D1 and a voltage (a connection point voltage VD2) generated at a connection point of the resistance element R2 and the resistance element R3. The control circuit 13 supplies the control current Ic corresponding to the control voltage VGN to the output node N101. For example, the control circuit 13 includes an NMOS transistor NM1 in which the control voltage VGN from the differential amplifier 12 is supplied to a gate thereof and PMOS transistors MP1 and MP2 which form a current mirror circuit.

The start-up circuit 14 supplies a start-up current Ist to the output node N101 in response to power supply (supply of a power supply voltage VDD) to the reference voltage generation circuit. For example, the start-up circuit 14 includes a current source 101 (a resistance element in this case), a PMOS transistor 102 (an input-side transistor), and a PMOS transistor 103 (an output-side transistor). The current source 101 and the PMOS transistor 102 are provided on a current path (a reference current path) from a power supply node to which the power supply voltage VDD is supplied to a ground node to which the ground voltage GND is supplied. The PMOS transistor 103 is provided on an output current path (a current path from the power supply node to the output node N101 in this case) through which the start-up current Ist is supplied to the output node N101. The PMOS transistors 102 and 103 form a current mirror circuit to generate, as the start-up current Ist, a current corresponding to a reference current Ir generated on the reference current path on the output current path.

[Stable State of Reference Voltage Generation Circuit]

The reference voltage generation circuit has two stable states (i.e., an operating stable state and a non-operating stable state). When the reference voltage generation circuit is in the operating stable state, the reference voltage VA has low dependence on the power supply voltage VDD and temperature, and is stabilized at a desired voltage level. On the other hand, when the reference voltage generation circuit is in the non-operating stable state, the reference voltage VA, the connection point voltages VD1 and VD2, and the control voltage VGN are stabilized at a voltage level close to the ground voltage GND, a control voltage VGP is stabilized at a voltage level close to the power supply voltage VDD. Thus, the differential amplifier 12 is in a halt state, and each of the transistors MN1, MP1 and MP2 is in an off state. Therefore, the reference voltage VA is stabilized at a voltage level lower than the desired voltage level, and thus, the reference voltage VA cannot be set to be a desired voltage level.

[Operation of Start-Up Circuit]

Next, the operation of the start-up circuit 14 of FIG. 1 will be described. In this case, it is assumed that, after power is supplied (after the power supply voltage VDD is supplied), the reference voltage generation circuit becomes the non-operating stable state.

In the start-up circuit 14, when the power supply voltage VDD is supplied, the reference current Ir is generated on the reference current path on which the current source 101 and the PMOS transistor 102 are provided, and the start-up current Ist is generated on the output current path on which the PMOS transistor 103 is provided. Thus, the start-up current Ist is supplied to the output node N101.

Next, in the voltage generation circuit 11, the start-up current Ist flows through a current path from the output node N101 to the diode D1 and a current path from the output node N101 to the diode D2, so that the reference voltage VA and the connection point voltages VD1 and VD2 are forced to increase. Due to the increase of the connection point voltages VD1 and VD2, the differential amplifier 12 transitions from a halt state to a drive state, and thus, the control voltage VGN increases. Next, the NMOS transistor MN1 becomes an on state, so that the control voltage VGP reduces and the control current Ic increases.

Thus, the reference voltage generation circuit is removed from the non-operating stable state, and then, the reference voltage generation circuit becomes the operating stable state, so that the reference voltage VA is stabilized at a desired voltage level (expressed by Equation 1 or Equation 2).

As described above, the reference voltage VA is directly increased by the start-up current Ist, and thus, a transition time from the non-operating stable state to the operating stable state can be reduced, as compared to a case where a voltage (e.g., the control voltage VGP, etc.) other than the reference voltage VA is directly increased. Therefore, the response characteristics of the reference voltage generation circuit to power supply can be improved.

As in conventional reference voltage generation circuits, when a current is directly drawn via the resistance element (or when a current is directly supplied from the power supply node via the resistive element), the size of the resistance element has to be increased in order to reduce the amount of the current drawn (or the amount of the current supplied). Therefore, it has been difficult to reduce a circuit area. However, according to this embodiment, the amount of the start-up current Ist can be arbitrarily changed by changing the mirror ratio of the current mirror circuit (the PMOS transistors 102 and 103). Thus, as compared to conventional reference voltage generation circuits, the increase in circuit area can be reduced, and the amount of the start-up current Ist can be more easily set.

Second Embodiment

FIG. 2 illustrates an example configuration of a reference voltage generation circuit according to a second embodiment. The reference voltage generation circuit includes, instead of the start-up circuit 14 of FIG. 1, a start-up circuit 24. The configurations of other components are similar to those of FIG. 1. The start-up circuit 24 supplies the start-up current Ist, and then, reduces the amount of the start-up current Ist in accordance with increase of the voltage level of the reference voltage VA. The start-up circuit 24 includes, in addition to the current source 101 and the PMOS transistors 102 and 103 of FIG. 1, a PMOS transistor 201 (an adjusting transistor). The PMOS transistor 201 is provided on the reference voltage current path with the current source 101 and the PMOS transistor 102, and is provided between the current source 101 and the ground node. The reference voltage VA generated at the output node N101 is supplied to a gate of the PMOS transistor 201.

[Operation of Start-Up Circuit]

Next, the operation of the start-up circuit 24 of FIG. 2 will be described. Note that the basic operation (of outputting of the start-up current Ist) of the start-up circuit 24 is similar to that of the start-up circuit 14 of FIG. 1.

When the reference voltage generation circuit is in the non-operating stable state, the reference voltage VA is at a voltage level close to the ground voltage GND, and thus, the PMOS transistor 201 is in an on state. Therefore, in the start-up circuit 24, the reference current Ir is generated on the reference voltage path, and the start-up current Ist is supplied to the output node N101. Accordingly, the reference voltage VA increases.

Next, a voltage at a connection point of the current source 101 and a source of the PMOS transistor 201 increases with the increase of the reference voltage VA. Thus, a potential difference across the current source 101 reduces, so that the reference current Ir reduces. Also, the start-up current Ist reduces with the reduction of the reference current Ir.

As described above, the power consumption of the start-up circuit 24 can be reduced by reducing the start-up current Ist in accordance with increase of the reference voltage VA. Also, influences of the start-up current Ist on the basic configuration (including the voltage generation circuit 11, the differential amplifier 12, and the control circuit 13) of the reference voltage generation circuit can be reduced, so that the reference voltage VA can be accurately generated.

Variations of Start-Up Circuit

Figure 3:
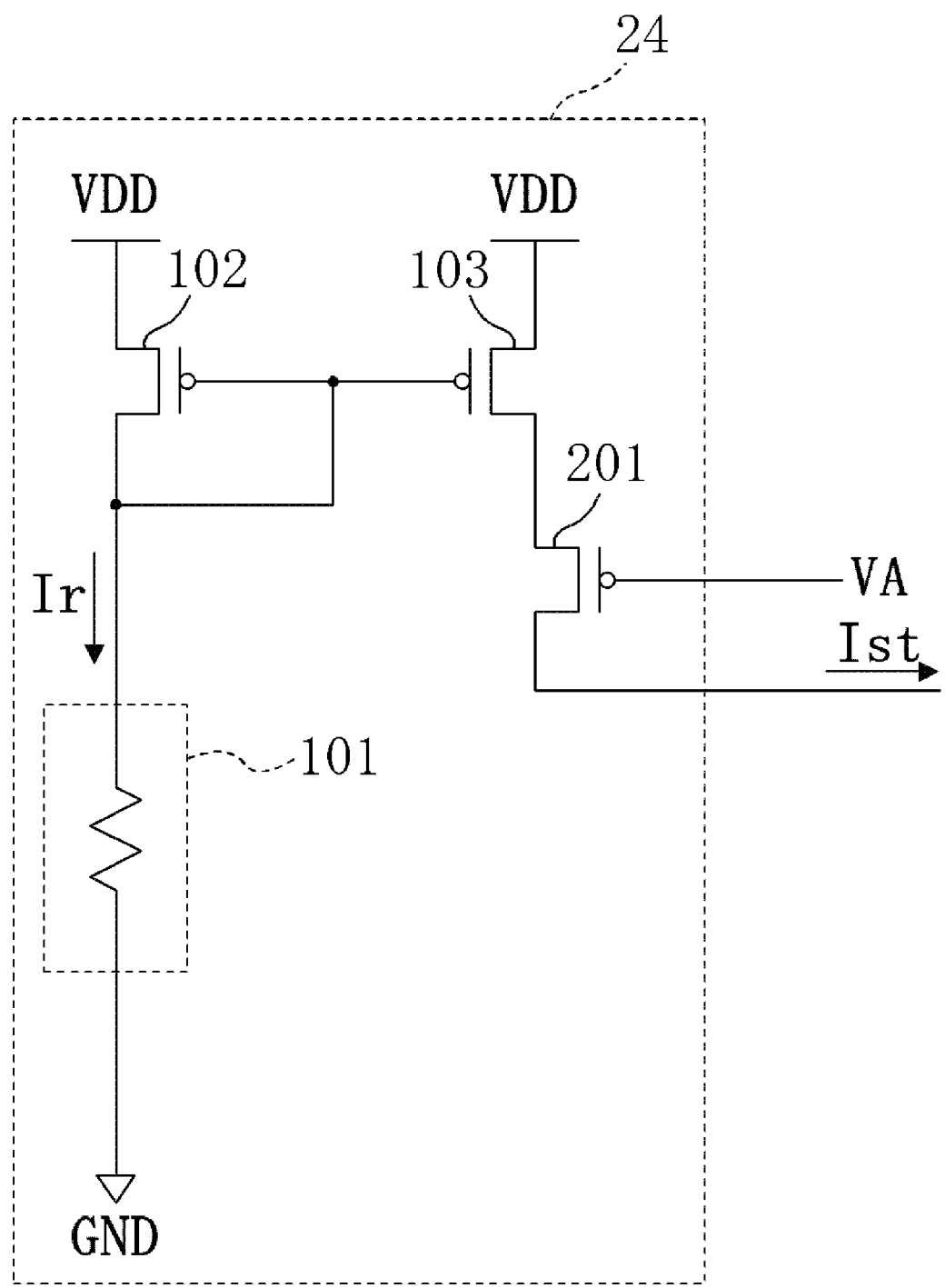
FIG. 3 is a diagram illustrating a variation of a start-up circuit of FIG. 2.

As shown in FIG. 3, in the start-up circuit 24, the PMOS transistor 201 may be provided on the output current path on which the PMOS transistor 103 is provided. In this case, an on-resistance of the PMOS transistor 201 increases with the increase of the reference voltage VA and, as a result, the start-up current Ist reduces.

Third Embodiment

Figure 4:
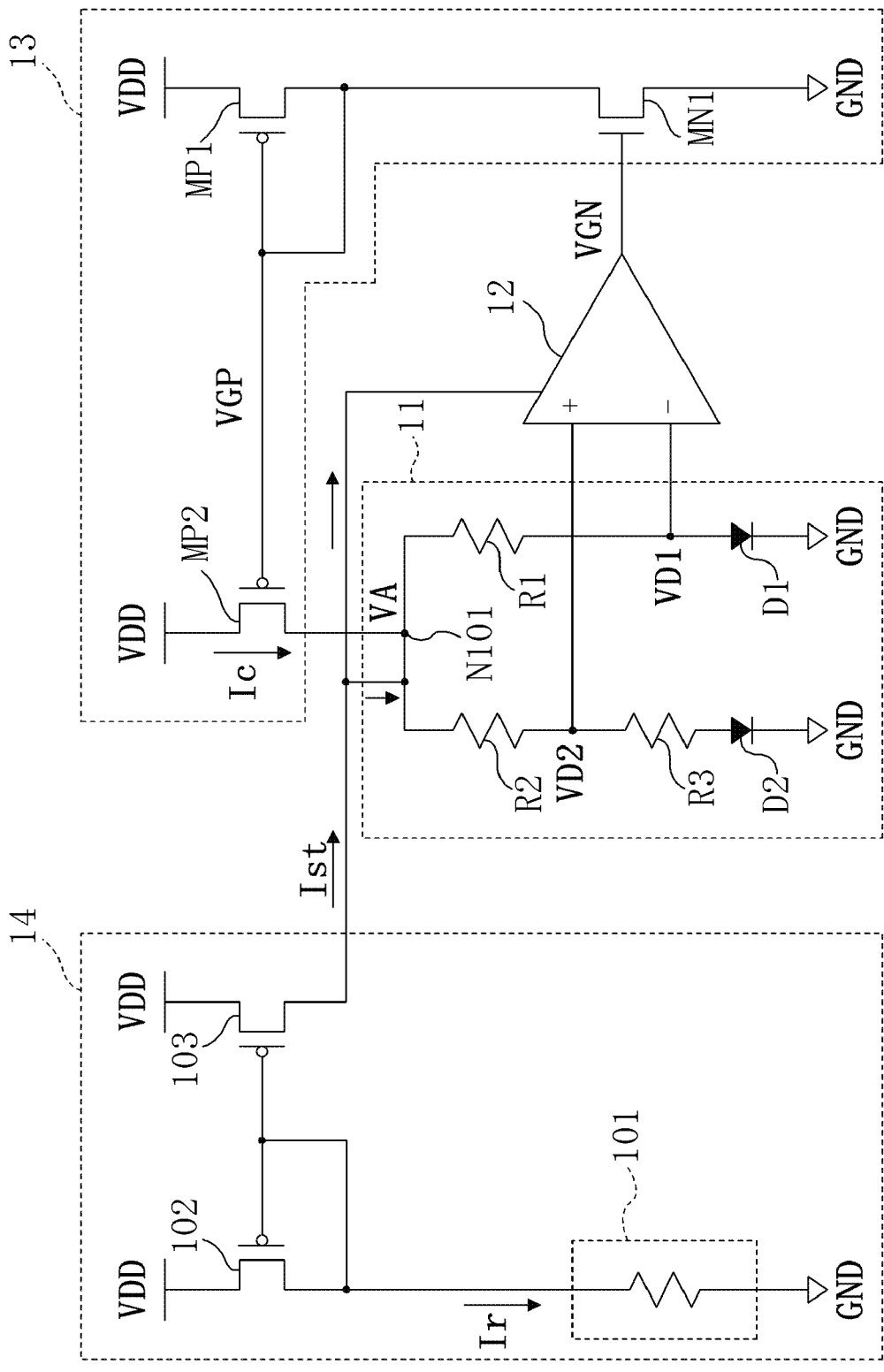
FIG. 4 is a diagram illustrating an example configuration of a reference voltage generation circuit according to a third embodiment.

FIG. 4 illustrates an example configuration of the reference voltage generation circuit according to a third embodiment. In the reference voltage generation circuit, the start-up circuit 14 supplies the start-up current Ist not only to the output node N101 but also to the differential amplifier 12. The configurations of other components are similar to those of FIG. 1.

Figure 5:
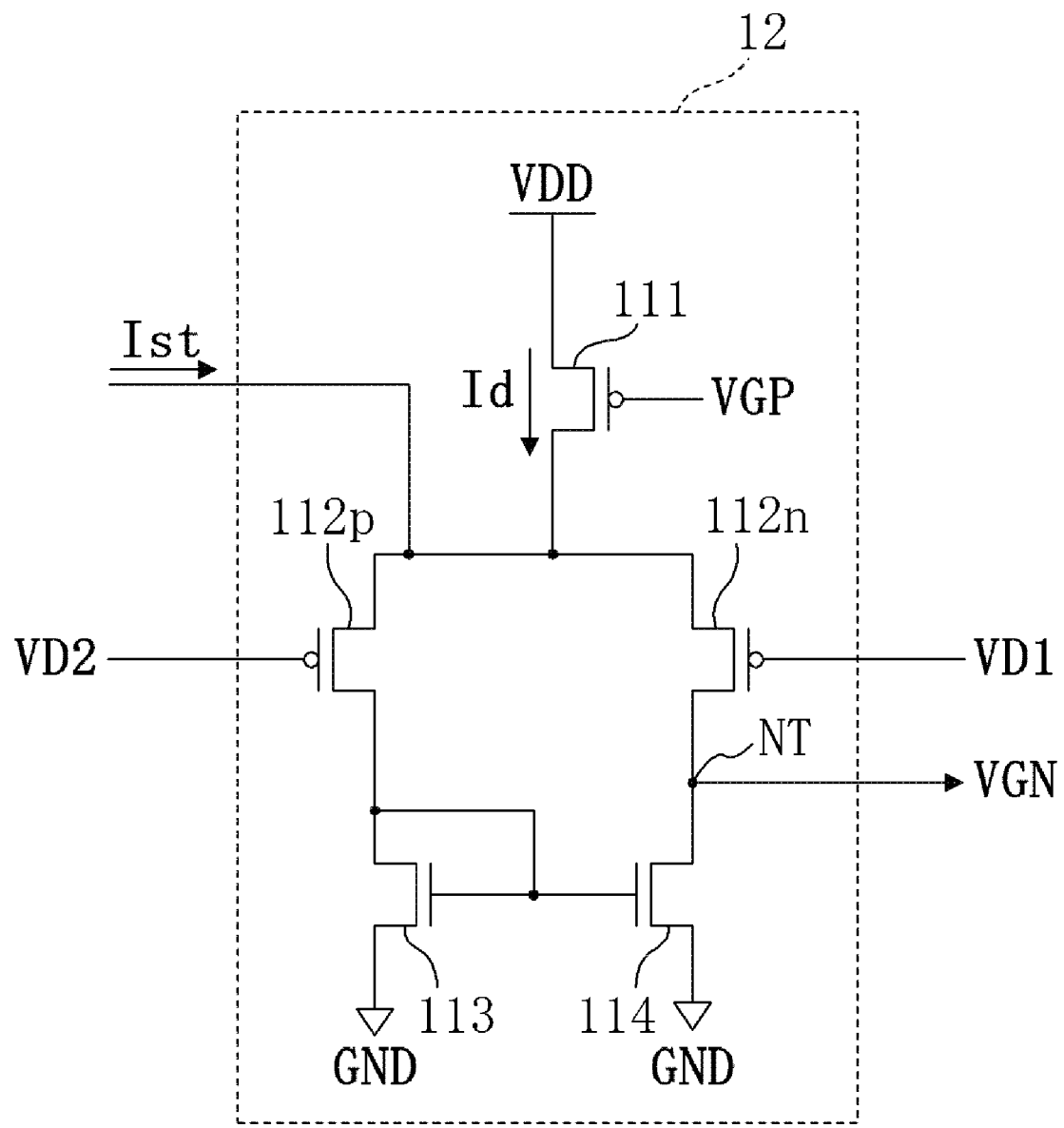
FIG. 5 is a diagram illustrating a point to which a start-up current is supplied in a differential amplifier of FIG. 4.

FIG. 5 illustrates an internal configuration of the differential amplifier 12. The differential amplifier 12 includes a current source transistor 111 configured to supply an operating current Id, differential transistors 112n and 112p in which the connection point voltages VD1 and VD2 are respectively supplied to respective gates thereof, and transistors 113 and 114 which form a current mirror circuit. The control voltage VGP is supplied to the gate of the current source transistor 111. In this case, the start-up current Ist is supplied to respective sources of the differential transistors 112n and 112p. That is, the start-up current Ist is supplied as the operating current Id of the differential amplifier 12.

[Operation of Differential Amplifier]

Next, the operation of the differential amplifier 12 of FIG. 5 will be described.

When the reference voltage generation circuit is in the non-operating stable state, the control voltage VGP is at a voltage level close to the power supply voltage VDD, and thus, the current source transistor 111 is in an off state. Therefore, the operating current Id is not supplied, and the differential amplifier 12 is in a halt state. Also, each of the connection point voltages VD1 and VD2 are stabilized at a voltage level close to the ground voltage GND.

In this case, when the start-up current Ist is supplied to the differential amplifier 12, the start-up current Ist flows through a current path on which a differential transistor 112n and a transistor 113 are provided, and a current path on which a differential transistor 112p and a transistor 114 are provided. As a result, a voltage (the control voltage VGN) at an output terminal NT is forced to increase. Thus, in the control circuit 13, the control voltage VGP reduces with the increase of the control voltage VGN, and the control current Ic increases.

As described above, the start-up current Ist is supplied not only to the output node N101 but also to the differential amplifier 12, thereby forcing the differential amplifier 12 to transition from a halt state to a drive state. Thus, the differential amplifier 12 can be reliably driven. Also, as compared to the case where the start-up current Ist is supplied only to the output node N101, the rate of increase of the control current Ic can be increased, so that a transition time from the non-operating stable state to the operating stable state can be further reduced.

Figure 6:
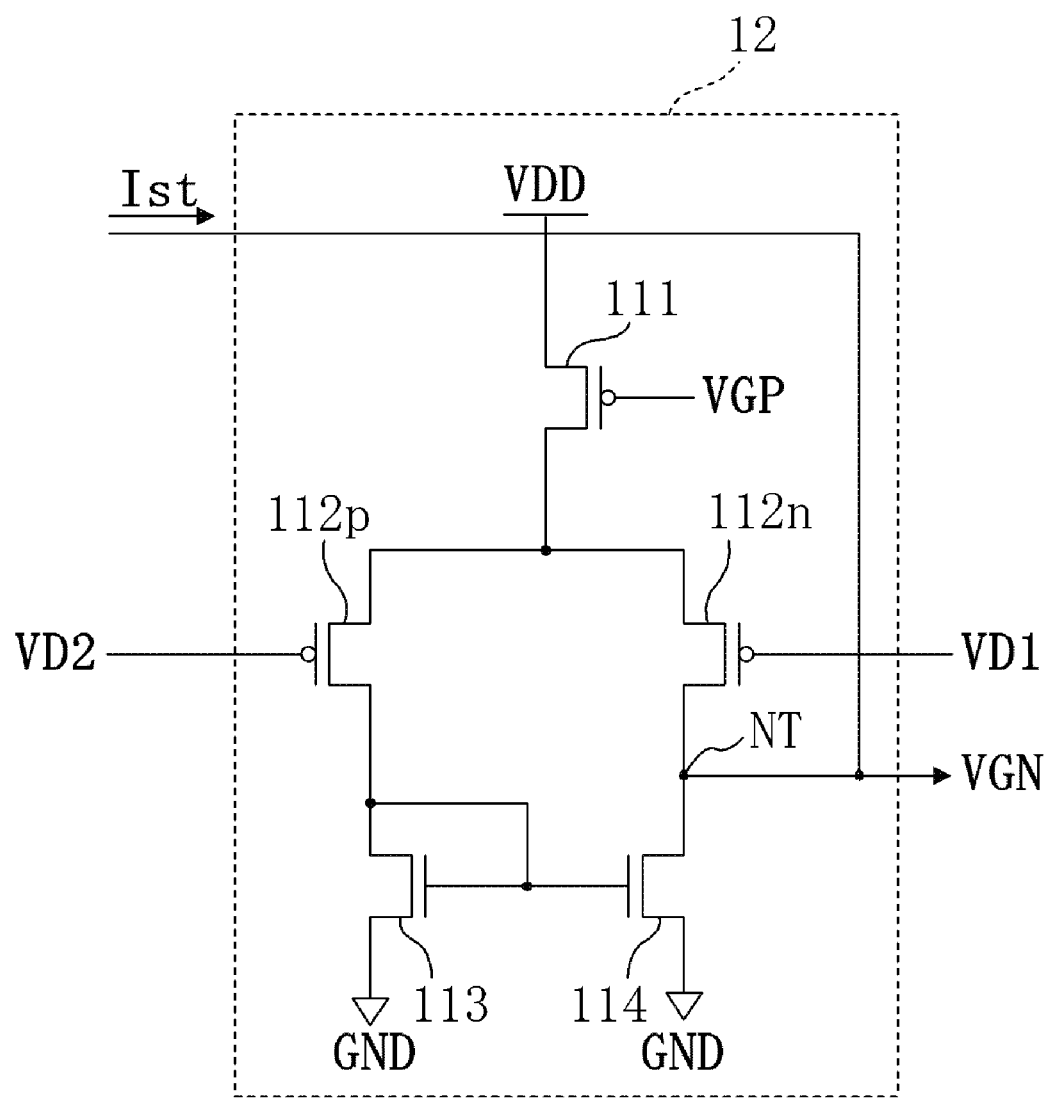
FIG. 6 is a diagram illustrating another point to which a start-up current is supplied in the differential amplifier of FIG. 4.

As shown in FIG. 6, the start-up current Ist may be supplied to an output terminal NT of the differential amplifier 12. In this case, a voltage (the control voltage VGN) of the output terminal NT can be forced to increase. Furthermore, the start-up current Ist may be supplied to each of the sources of the differential transistors 112n and 112p and the output terminal NT.

The start-up circuit 14 may supply the start-up current only to the differential amplifier 12. In this case, the amount of the start-up current Ist can be arbitrarily changed by changing the mirror ratio of the current mirror circuit (the PMOS transistors 102 and 103). Thus, as compared to conventional reference voltage generation circuits, the increase in circuit area can be reduced, and the amount of the start-up current Ist can be easily set.

Variation 1 of Third Embodiment

Figure 7:
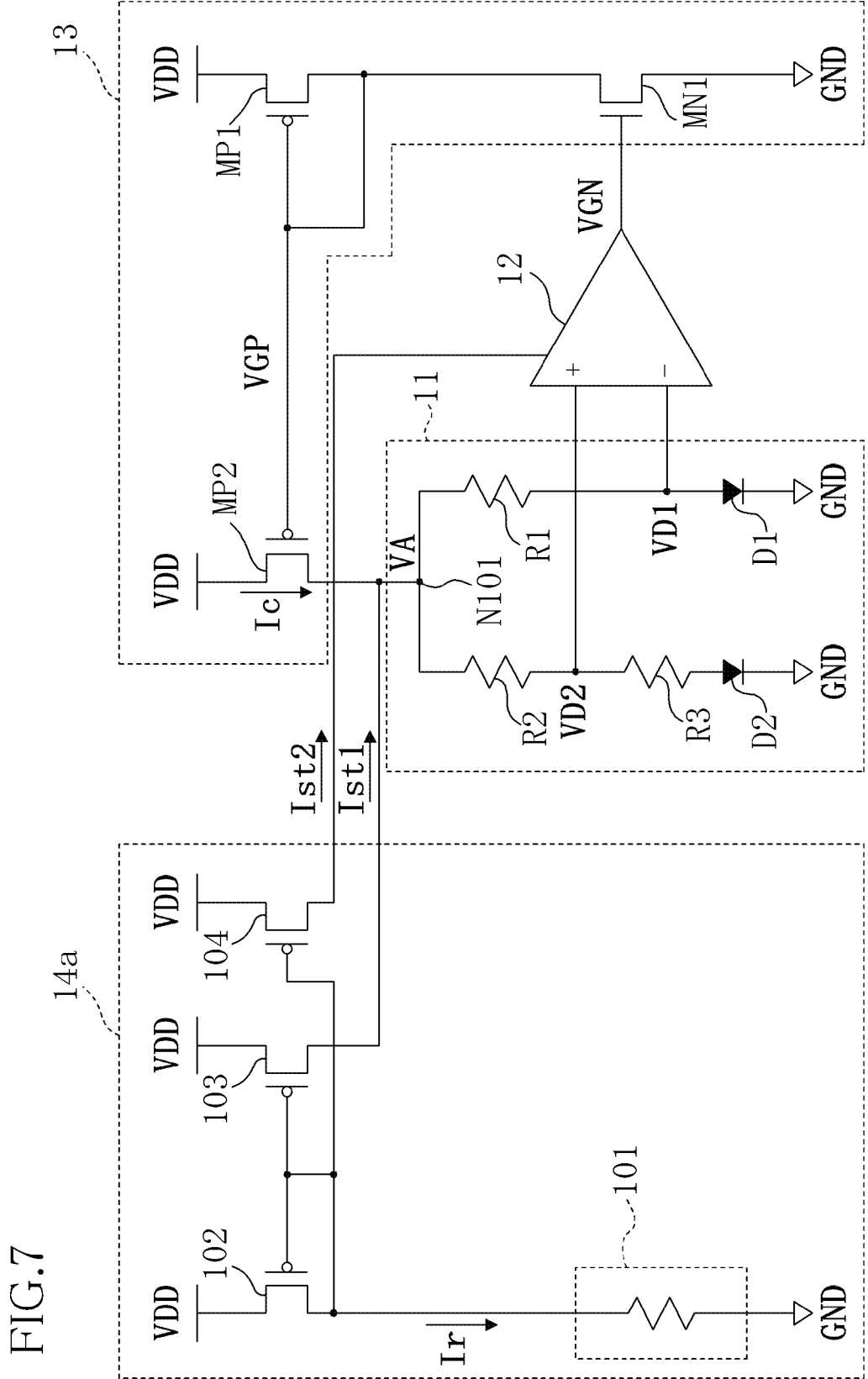
FIG. 7 is a diagram illustrating a variation of the reference voltage generation circuit of FIG. 4.

Furthermore, as shown in FIG. 7, start-up currents Ist1 and Ist2 may be separately supplied to the output node N101 and the differential amplifier 12, respectively. A reference voltage generation circuit of FIG. 7 includes, instead of the start-up circuit 14 of FIG. 4, a start-up circuit 14a. The configurations of other components are similar to those of FIG. 4. The start-up circuit 14a includes, in addition to the current source 101 and the PMOS transistors 102 and 103 of FIG. 4, a PMOS transistor 104 (a second output-side transistor). The PMOS transistor 103 (the first output-side transistor) is provided on a current path (a first current path) from the power supply node to the output node N101, and the PMOS transistor 104 is provided on a current path (a second current path) from the power supply node to the differential amplifier 12. The PMOS transistors 102, 103, and 104 form a current mirror circuit, and generates the start-up currents Ist1 and Ist2 corresponding to the reference current Ir generated at the reference current path on the first and second current paths, respectively.

With the above-described configuration, start-up currents which are appropriate for the output node N101 and the differential amplifier 12 can be supplied to the output node N101 and the differential amplifier 12, respectively. Each of the respective amounts of the start-up currents Ist1 and Ist2 can be easily set at a desired value by changing the mirror ratio of the current mirror circuit (the PMOS transistors 102, 103, and 104).

Fourth Embodiment

FIG. 8 illustrates a configuration of a reference voltage generation circuit according to a fourth embodiment. In the reference voltage generation circuit, the start-up circuit 24 supplies the start-up current Ist not only to the output node N101 but also to the differential amplifier 12. The configurations of other components are similar to those of FIG. 2. As described above, the start-up current Ist is supplied not only to the output node N101 but also to the differential amplifier 12. Thus, the differential amplifier 12 can be reliably driven, and also, the rate of the increase of the control current Ic can be increased. Also, the start-up current Ist is reduced in accordance with the increase of the reference voltage VA. Thus, the power consumption of the start-up circuit 24 can be reduced, and also, the reference voltage VA can be accurately generated.

Also, the start-up circuit 24 may be supply the start-up current Ist only to the differential amplifier 12. In this case, the power consumption of the start-up circuit 24 can be reduced, and also, the reference voltage VA can be accurately generated.

Variations of Fourth Embodiment

Figure 9:
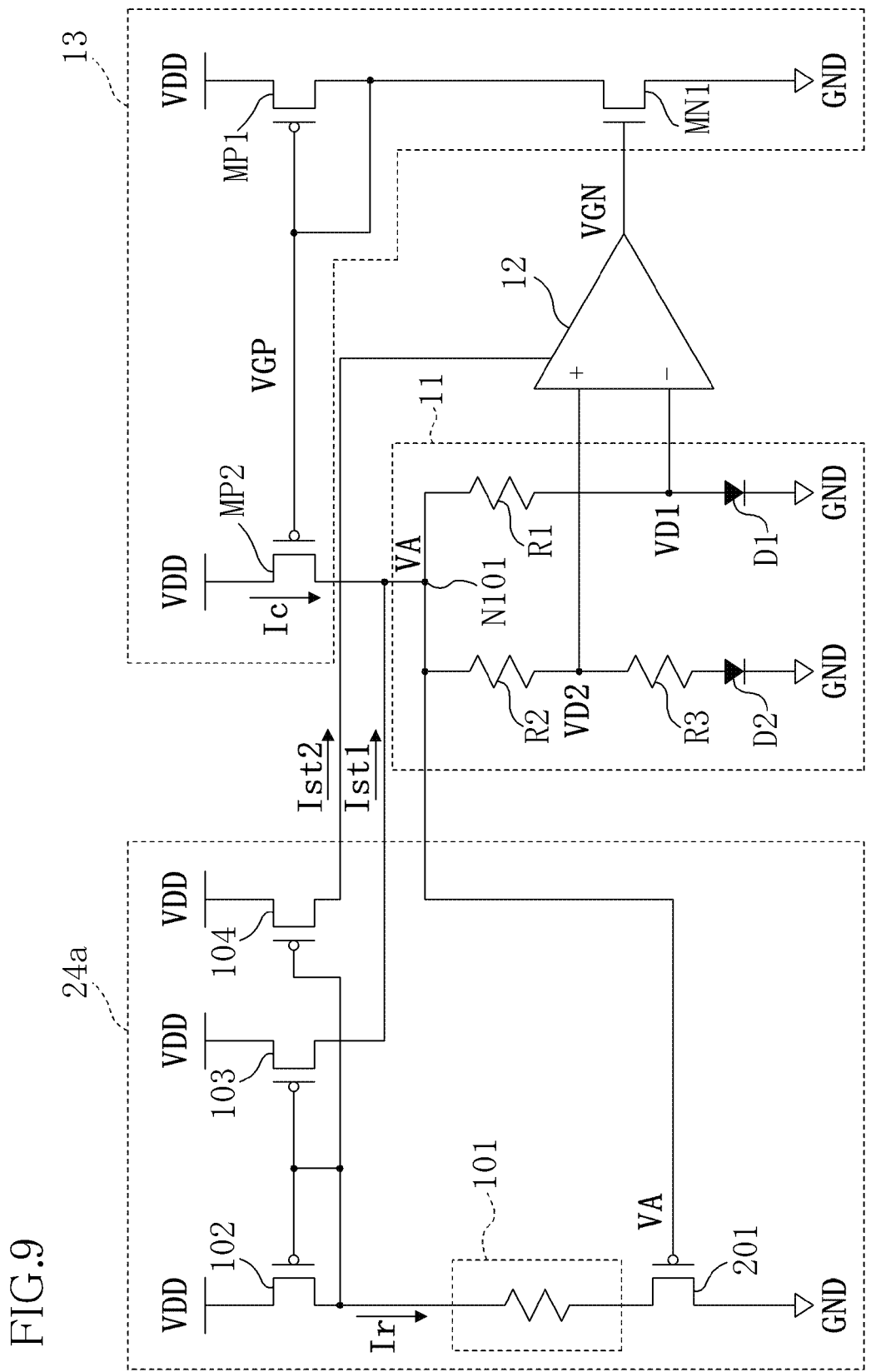
FIG. 9 is a diagram illustrating a variation of the reference voltage generation circuit of FIG. 8.
Figure 10:
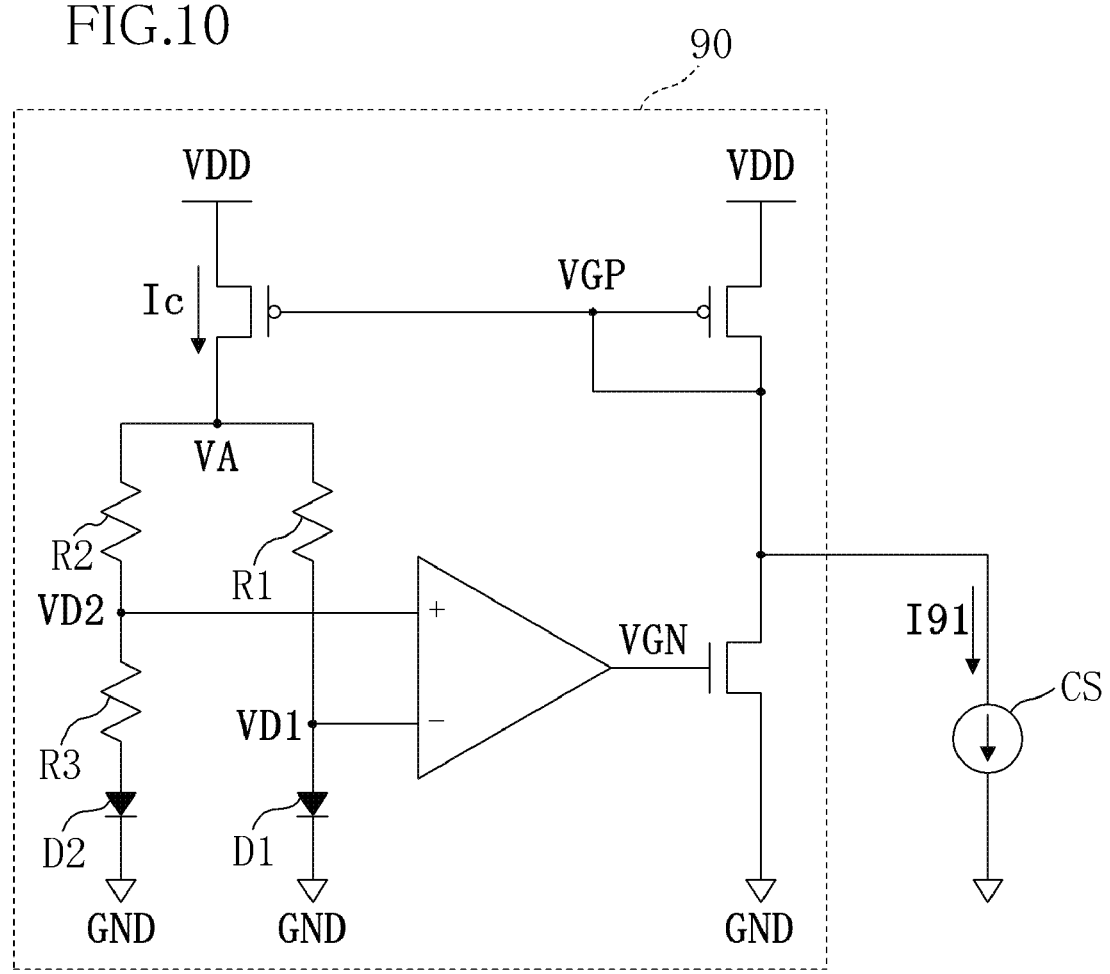
FIG. 10 is a diagram illustrating a configuration of a conventional reference voltage generation circuit.
Figure 11:
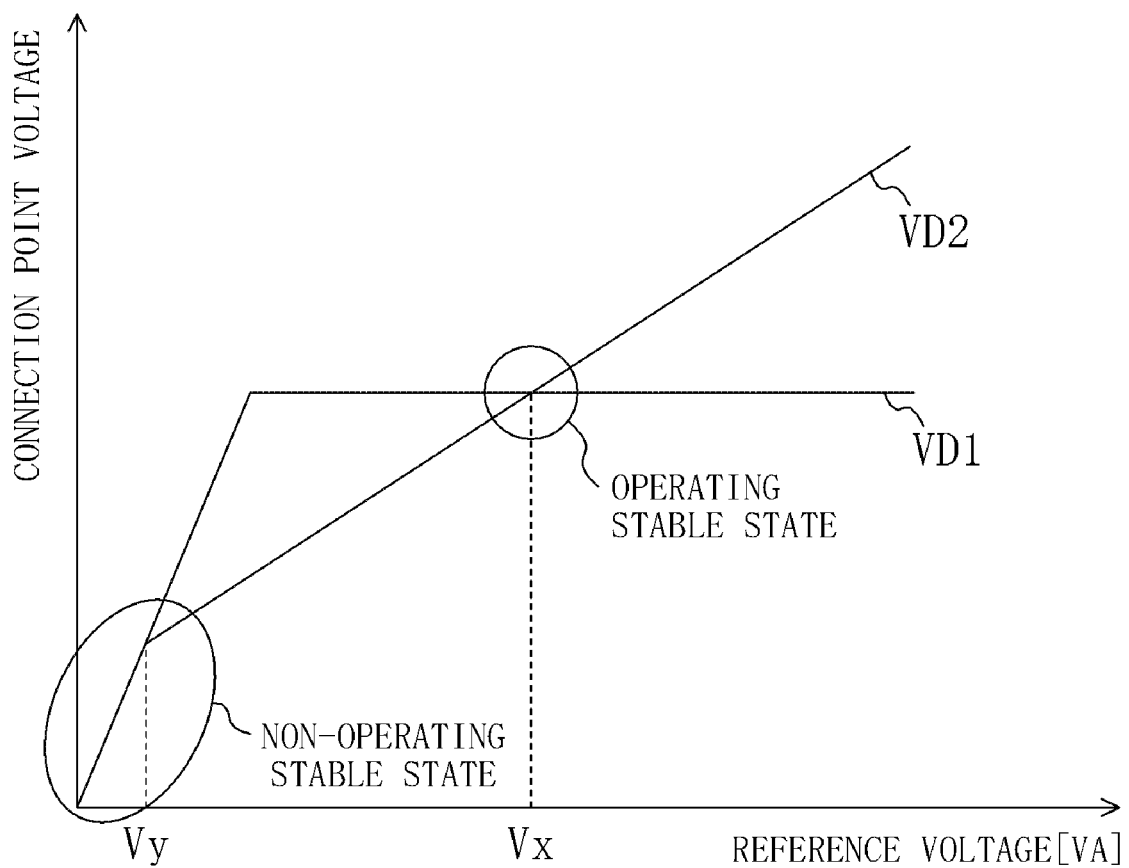
FIG. 11 is a graph showing the relationship between a reference voltage and connection point voltages.
Figure 12:
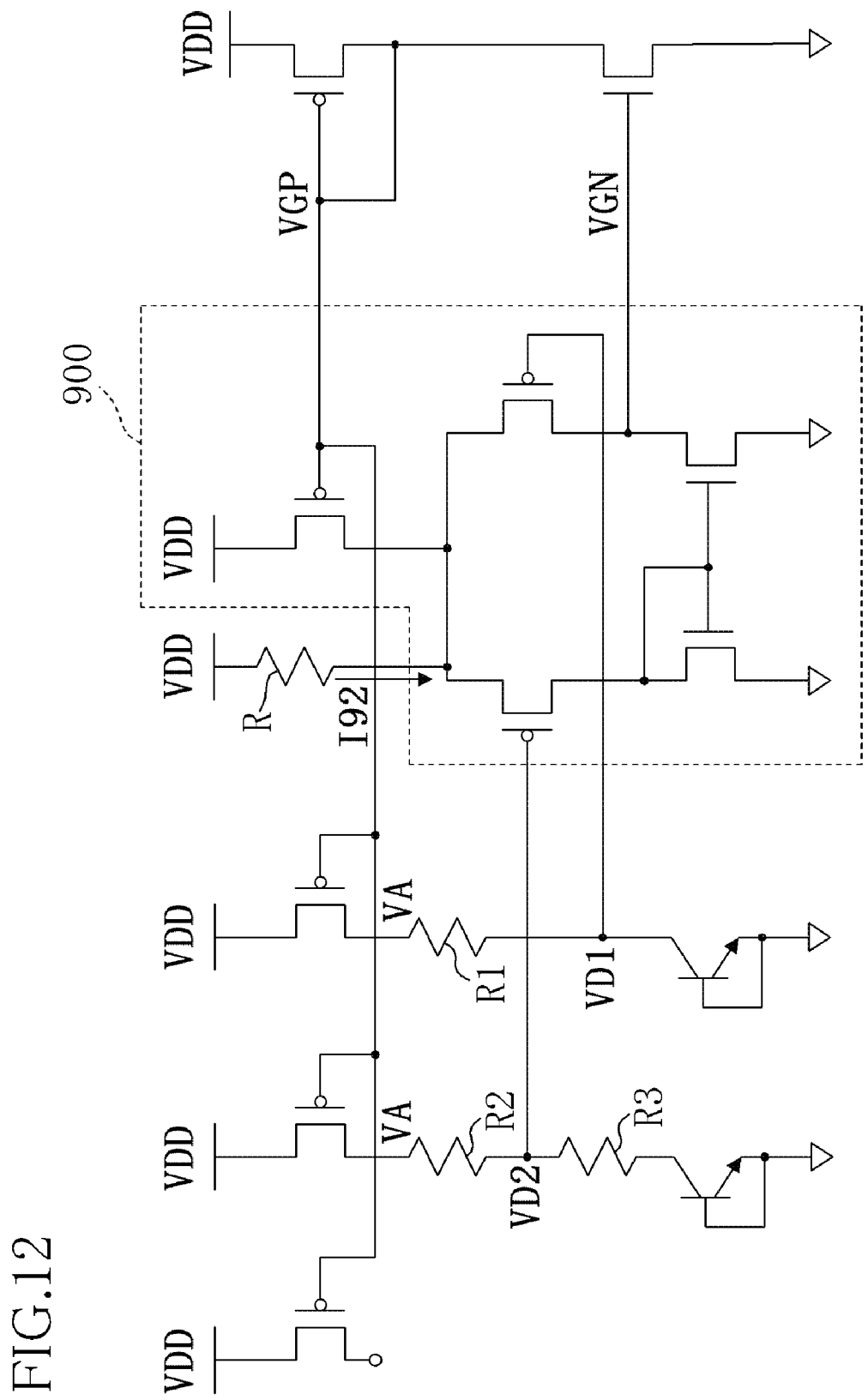
FIG. 12 is a diagram illustrating a configuration of a conventional reference voltage generation circuit.

As shown in FIG. 9, the start-up currents Ist1 and Ist2 may be separately supplied to the output node N101 and the differential amplifier 12, respectively. The reference voltage generation circuit of FIG. 9 includes, instead of the start-up circuit 24 of FIG. 8, a start-up circuit 24a. The configurations of other components are similar to those of FIG. 8. The start-up circuit 24a includes, in addition to the current source 101 and the PMOS transistors 102 and 103 of FIG. 8, the PMOS transistor 104 (the second output-side transistor). With the above-described configuration, start-up currents which are appropriate for the output node N101 and the differential amplifier 12 can be supplied to the output node N101 and the differential amplifier 12, respectively.

Other Embodiments

In each of the above-described embodiments, the rectifying elements D1 and D2 have been described as diodes. However, each of the rectifying elements D1 and D2 may be a diode-connected transistor. Also, the current source 101 has been described as a resistance element, but the current source 101 may be some other constant current circuit. Moreover, in the differential amplifier 12, another constant voltage which is different from the control voltage VGP may be supplied to the gate of the current source transistor 111.

As described above, a reference voltage generation circuit according to the present disclosure is useful as a bandgap reference circuit configured to generate a reference voltage with low dependence on the power supply voltage and temperature, etc.

Note that the foregoing embodiments have been set forth merely for purposes of preferred examples in nature, and are not intended to limit the scope, applications, and use of the invention.

What is claimed is:

1. A reference voltage generation circuit which generates a reference voltage, the circuit comprising:
a voltage generation circuit including a first rectifying element, a first resistance element coupled between the first rectifying element and an output node at which the reference voltage is generated, a second rectifying element, and second and third resistance elements coupled in series between the second rectifying element and the output node;
a differential amplifier configured to output a control voltage corresponding to a difference between a first voltage generated at a connection point of the first rectifying element and the first resistance element and a second voltage generated at a connection point of the second resistance element and the third resistance element;
a control circuit configured to supply a control current corresponding to the control voltage from the differential amplifier to the output node; and
a start-up circuit configured to cause, by supplying a start-up current to the differential circuit in response to supply of a power supply voltage, a transition from a first stable state where the reference voltage is stabilized at a voltage level lower than a desired voltage level to a second stable state where the reference voltage is stabilized at the desired voltage level,
wherein the start-up circuit includes
a current source provided on a reference current path from a power supply node to which the power supply voltage is supplied to a ground node, and
a current mirror circuit configured to generate a current corresponding to a reference current generated on the reference current path on an output current path through which the start-up current is to the differential amplifier.

2. A reference voltage generation circuit which generates a reference voltage, the circuit comprising:
a voltage generation circuit including a first rectifying element, a first resistance element coupled between the first rectifying element and an output node at which the reference voltage is generated, a second rectifying element, and second and third resistance elements coupled in series between the second rectifying element and the output node;
a differential amplifier configured to output a control voltage corresponding to a difference between a first voltage generated at a connection point of the first rectifying element and the first resistance element and a second voltage generated at a connection point of the second resistance element and the third resistance element;
a control circuit configured to supply a control current corresponding to the control voltage from the differential amplifier to the output node; and
a start-up circuit configured to cause, by supplying a start-up current to the differential circuit in response to supply of a power supply voltage, a transition from a first stable state where the reference voltage is stabilized at a voltage level lower than a desired voltage level to a second stable state where the reference voltage is stabilized at the desired voltage level, and reduce the start-up current in accordance with increase of the reference voltage generated at the output node.

3. A reference voltage generation circuit which generates a reference voltage, the circuit comprising:
- a voltage generation circuit including a first rectifying element, a first resistance element coupled between the first rectifying element and an output node at which the reference voltage is generated, a second rectifying element, and second and third resistance elements coupled in series between the second rectifying element and the output node;
- a differential amplifier configured to output a control voltage corresponding to a difference between a first voltage generated at a connection point of the first rectifying element and the first resistance element and a second voltage generated at a connection point of the second resistance element and the third resistance element;
- a control circuit configured to supply a control current corresponding to the control voltage from the differential amplifier to the output node; and
- a start-up circuit configured to cause, by supplying a start-up current to the output node in response to supply of a power supply voltage, a transition from a first stable state where the reference voltage is stabilized at a voltage level lower than a desired voltage level to a second stable state where the reference voltage is stabilized at the desired voltage level,
- wherein the start-up circuit reduces the start-up current in accordance with increase of the reference voltage generated at the output node, and
- the start-up circuit also supplies the start-up current to the differential amplifier.

4. The reference voltage generation circuit of claim 3, wherein the start-up circuit includes
- a current source provided on a reference current path from a power supply node to which the power supply voltage is supplied to a ground node,
- a current mirror circuit configured to generate a current corresponding to a reference current generated on the reference current path on an output current path through which the start-up current is supplied to the output node and the differential amplifier, and
- an adjusting transistor provided on one of the reference current path and the output current path, and configured to receive the reference voltage generated at the output node to adjust an amount of a current flowing through the one of the current paths.

5. The reference voltage generation circuit of claim 4, wherein the current mirror circuit includes
- an input-side transistor which is provided on the reference current path and whose gate and drain are coupled to each other, and
- an output-side transistor which is provided on the reference current path and whose gate is coupled to the gate of the input-side transistor.

6. The reference voltage generation circuit of claim 4, wherein
- the output current path includes
  - a first current path from the power supply node to the output node, and
  - a second current path from the power supply node to the differential amplifier, and
- the current mirror circuit includes
  - an input-side transistor which is provided on the reference current path and whose gate and drain are coupled to each other,
  - a first output-side transistor which is provided on the first current path and whose gate is coupled to the gate of the input-side transistor, and
  - a second output-side transistor which is provided on the second current path and whose gate is coupled to the gate of the input-side transistor.

7. The reference voltage generation circuit of claim 3, wherein the start-up circuit supplies the start-up current as an operating current of the differential amplifier to the differential amplifier.

8. The reference voltage generation circuit of claim 3, wherein the start-up circuit supplies the start-up current to an output terminal of the differential amplifier.

9. A reference voltage generation circuit which generates a reference voltage, the circuit comprising:
- a voltage generation circuit including a first rectifying element, a first resistance element coupled between the first rectifying element and an output node at which the reference voltage is generated, a second rectifying element, and second and third resistance elements coupled in series between the second rectifying element and the output node;
- a differential amplifier configured to output a control voltage corresponding to a difference between a first voltage generated at a connection point of the first rectifying element and the first resistance element and a second voltage generated at a connection point of the second resistance element and the third resistance element;
- a control circuit configured to supply a control current corresponding to the control voltage from the differential amplifier to the output node; and
- a start-up circuit configured to cause, by supplying a start-up current to the output node in response to supply of a power supply voltage, a transition from a first stable state where the reference voltage is stabilized at a voltage level lower than a desired voltage level to a second stable state where the reference voltage is stabilized at the desired voltage level,
- wherein the start-up circuit includes
  - a current source provided on a reference current path from a power supply node to which the power supply voltage is supplied to a ground node, and
  - a current mirror circuit configured to generate a current corresponding to a reference current generated on the reference current path on an output current path through which the start-up current is supplied to the output node.

10. A reference voltage generation circuit which generates a reference voltage, the circuit comprising:
- a voltage generation circuit including a first rectifying element, a first resistance element coupled between the first rectifying element and an output node at which the reference voltage is generated, a second rectifying element, and second and third resistance elements coupled in series between the second rectifying element and the output node;
- a differential amplifier configured to output a control voltage corresponding to a difference between a first voltage generated at a connection point of the first rectifying element and the first resistance element and a second voltage generated at a connection point of the second resistance element and the third resistance element;
- a control circuit configured to supply a control current corresponding to the control voltage from the differential amplifier to the output node; and
- a start-up circuit configured to cause, by supplying a start-up current to the output node in response to supply of a power supply voltage, a transition from a first stable state where the reference voltage is stabilized at a voltage level lower than a desired voltage level to a second stable state where the reference voltage is stabilized at the desired voltage level, wherein the start-up circuit also supplies the start-up current to the differential amplifier.

11. The reference voltage generation circuit of claim 10, wherein the start-up circuit includes a current source provided on a reference current path from a power supply node to which the power supply voltage is supplied to a ground node, and a current mirror circuit configured to generate a current corresponding to a reference current generated on the reference current path on an output current path through which the start-up current is supplied to the output node and the differential amplifier.

* * * * *